(12) United States Patent
Miyashiro et al.

(10) Patent No.: US 10,744,591 B2
(45) Date of Patent: Aug. 18, 2020

(54) ULTRASONIC BONDING JIG, BONDING STRUCTURE, AND BONDING METHOD

(71) Applicant: NIPPON MEKTRON, LTD., Tokyo (JP)

(72) Inventors: Hiroshi Miyashiro, Tokyo (JP); Yoichi Suruga, Tokyo (JP); Shuhei Koyano, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 252 days.

(21) Appl. No.: 15/923,493

(22) Filed: Mar. 16, 2018

(65) Prior Publication Data

US 2019/0009357 A1     Jan. 10, 2019

(30) Foreign Application Priority Data

Jul. 6, 2017    (JP) .................................. 2017-133171

(51) Int. Cl.
| | | |
|---|---|---|
| *B23K 20/10* | (2006.01) | |
| *H05K 3/32* | (2006.01) | |
| *H01L 23/00* | (2006.01) | |
| *B23K 101/38* | (2006.01) | |
| *B23K 101/42* | (2006.01) | |
| *H05K 1/18* | (2006.01) | |

(52) U.S. Cl.
CPC ............ *B23K 20/106* (2013.01); *H01L 24/78* (2013.01); *H05K 3/328* (2013.01); *B23K 2101/38* (2018.08); *B23K 2101/42* (2018.08); *H05K 1/189* (2013.01); *H05K 2201/10272* (2013.01); *H05K 2203/0195* (2013.01); *H05K 2203/0285* (2013.01)

(58) Field of Classification Search
CPC .......................... B23K 1/06; B23K 20/10–106
USPC ................... 228/1.1, 110.1; 156/580.1–580.2
See application file for complete search history.

(56) References Cited

U.S. PATENT DOCUMENTS

| | | | | |
|---|---|---|---|---|
| 4,767,492 A | * | 8/1988 | Fukusima | B29C 65/08 156/580.2 |
| 4,776,509 A | * | 10/1988 | Pitts | B23K 20/106 219/56.1 |
| 4,798,639 A | * | 1/1989 | Yamaguchi | B29C 43/146 156/73.1 |
| 4,904,319 A | * | 2/1990 | Divincenzo | B29C 65/08 156/73.4 |

(Continued)

FOREIGN PATENT DOCUMENTS

| | | | | | |
|---|---|---|---|---|---|
| EP | | 1685919 A1 | * | 8/2006 | ............. B23K 20/10 |
| JP | | 58100989 A | * | 6/1983 | ............. B23K 20/10 |

(Continued)

*Primary Examiner* — Kiley S Stoner
(74) *Attorney, Agent, or Firm* — Studebaker & Brackett PC (57) ABSTRACT

An ultrasonic bonding jig includes: a base; and a protrusion portion which has a protrusion portion end surface approximately parallel to the base and which has a pair of first walls, the pair of first walls being disposed upright approximately perpendicular to the base from opposed sides of the protrusion portion end surface. A bonding structure includes a bonding portion of a metal plate and a base material. The bonding portion has a recessed portion with a closed bottom on a surface of the metal plate, and the recessed portion has a pair of walls approximately perpendicular to the surface of the metal plate.

5 Claims, 8 Drawing Sheets

(56) References Cited

U.S. PATENT DOCUMENTS

| | | | | |
|---|---|---|---|---|
| 5,153,981 A * | 10/1992 | Soto | H01L 21/67144 | 29/701 |
| 5,390,844 A * | 2/1995 | Distefano | B23K 20/025 | 228/180.21 |
| 5,525,172 A * | 6/1996 | Cadiou | B06B 3/02 | 156/290 |
| 5,642,852 A * | 7/1997 | Suzuki | B23K 20/10 | 228/110.1 |
| 5,816,472 A * | 10/1998 | Linn | B23K 20/004 | 228/1.1 |
| 5,868,301 A * | 2/1999 | Distefano | B23K 20/025 | 228/1.1 |
| 6,089,438 A * | 7/2000 | Suzuki | B23K 20/10 | 228/1.1 |
| 6,165,298 A * | 12/2000 | Samida | B29C 66/83411 | 156/552 |
| 6,523,732 B1 * | 2/2003 | Popoola | B23K 20/106 | 228/1.1 |
| 6,523,734 B1 * | 2/2003 | Kawai | G06K 19/07718 | 156/73.1 |
| 6,562,166 B2 * | 5/2003 | Molander | A61F 13/15585 | 156/73.1 |
| 6,588,646 B2 * | 7/2003 | Loprire | B23K 20/10 | 228/110.1 |
| 6,824,630 B2 * | 11/2004 | Oishi | B23K 20/106 | 156/73.1 |
| 6,935,548 B2 * | 8/2005 | Reiber | B23K 20/004 | 228/4.5 |
| 6,935,551 B2 * | 8/2005 | Kondo | B23K 20/10 | 228/1.1 |
| 7,247,588 B2 * | 7/2007 | Kwon | B23K 20/106 | 501/105 |
| 7,285,447 B2 * | 10/2007 | Davison | H01L 21/4867 | 257/E21.577 |
| 7,337,938 B2 * | 3/2008 | Noro | B23K 20/106 | 156/580.1 |
| 7,407,079 B2 * | 8/2008 | Copperthite | B21K 25/00 | 228/180.5 |
| 7,793,815 B2 * | 9/2010 | Shimizu | B23K 20/10 | 156/73.1 |
| 7,838,101 B2 * | 11/2010 | Delsman | B23K 20/004 | 428/172 |
| 9,259,799 B2 * | 2/2016 | Kim | B23K 20/106 | |
| 9,458,629 B2 * | 10/2016 | Bauer | B29C 65/08 | |
| 9,607,739 B2 * | 3/2017 | Ozaki | B23K 20/106 | |
| 9,929,122 B2 * | 3/2018 | Delsman | H01L 24/78 | |
| 9,981,336 B2 * | 5/2018 | Poncelet | B23K 20/004 | |
| 2004/0020580 A1 * | 2/2004 | Oishi | B23K 20/106 | 156/73.1 |
| 2004/0266064 A1 * | 12/2004 | Davison | H01L 21/4867 | 438/120 |
| 2006/0065697 A1 * | 3/2006 | Kobae | B23K 20/10 | 228/110.1 |
| 2006/0163315 A1 * | 7/2006 | Delsman | B23K 20/004 | 228/1.1 |
| 2006/0180635 A1 * | 8/2006 | Lim | B23K 20/10 | 228/1.1 |
| 2008/0197172 A1 * | 8/2008 | Reiber | B23K 20/10 | 228/180.5 |
| 2009/0001135 A1 * | 1/2009 | Kishimoto | B23K 20/10 | 228/110.1 |
| 2010/0140325 A1 * | 6/2010 | Tokutomi | B23K 20/106 | 228/110.1 |
| 2011/0248069 A1 * | 10/2011 | Khakhalev | B23K 20/106 | 228/110.1 |
| 2012/0097339 A1 * | 4/2012 | Hull | B29C 65/08 | 156/580.1 |
| 2013/0119111 A1 * | 5/2013 | Delsman | H01L 24/85 | 228/1.1 |
| 2013/0139955 A1 | 6/2013 | Regenberg et al. | | |
| 2013/0213552 A1 * | 8/2013 | Kelch | B29C 66/1122 | 156/73.1 |
| 2014/0147716 A1 * | 5/2014 | Oh | H01M 10/0587 | 429/94 |
| 2014/0190638 A1 * | 7/2014 | Hull | B65B 51/225 | 156/580.2 |
| 2014/0338842 A1 * | 11/2014 | Hull | B29C 65/7451 | 156/580.2 |
| 2015/0090405 A1 * | 4/2015 | Hull | B65B 51/225 | 156/580.2 |
| 2015/0290873 A1 * | 10/2015 | Hull | B29C 66/43 | 156/580.2 |
| 2018/0369953 A1 * | 12/2018 | Miyashiro | B23K 20/106 | |
| 2019/0001583 A1 * | 1/2019 | Sato | B29C 66/8322 | |
| 2019/0047079 A1 * | 2/2019 | Miyashiro | B23K 20/10 | |
| 2019/0054562 A1 * | 2/2019 | Miyashiro | B29C 65/08 | |

FOREIGN PATENT DOCUMENTS

| | | | | |
|---|---|---|---|---|
| JP | 62282914 A | * | 12/1987 | ........ B29C 66/81433 |
| JP | 2004063376 A | * | 2/2004 | ........ B29C 66/81425 |
| JP | 2009010294 A | * | 1/2009 | ............ H01L 24/40 |
| JP | 2013-538128 A | | 10/2013 | |
| WO | WO-2006081106 A1 | * | 8/2006 | ............ H01L 24/85 |
| WO | 2013/105361 A1 | | 7/2013 | |
| WO | WO-2018025362 A1 | * | 2/2018 | ............ B23K 20/02 |

* cited by examiner

ULTRASONIC BONDING JIG, BONDING STRUCTURE, AND BONDING METHOD

CROSS-REFERENCE TO RELATED APPLICATION

This application claims priority from Japanese Patent Application No. 2017-133171 filed with the Japan Patent Office on Jul. 6, 2017, the entire content of which is hereby incorporated by reference.

BACKGROUND

1. Technical Field

The present disclosure relates to an ultrasonic bonding jig, a bonding structure, and a bonding method.

2. Description of the Related Art

Typically, ultrasonic bonding is performed by vibration of an electrode laminated body pressed to between a chip with a plurality of protrusions and an anvil. Protrusions disposed on an outermost periphery among the plurality of protrusions are, for example, chamfered protrusions formed by performing chamfering such that the protrusions have an arc having a radius R meeting R≥A/6 with an eternal dimension in the one direction defined as A on a contour line. This restrains a break of the electrode laminated body caused by ultrasonic welding (for example, see WO 2013/105361 A (the sixth page)).

Additionally, there has been known an ultrasonic welding bonding method using a torsion sonotrode (for example, see JP-T-2013-538128 (the third page, FIGS. 1 to 3)). In an ultrasonic welding treatment process, a torsion sonotrode contact surface has a flat stop surface extending in an actually perpendicular direction with respect to a torsion axis. Press-fitting protrusion portions protruding from this stop surface into a component combines the contact surface with the component. Furthermore, the flat stop surface settles an approach depth of the protrusion portions to the component. Therefore, the ultrasonic welding has a constant strength.

SUMMARY

An ultrasonic bonding jig includes: a base; and a protrusion portion which has a protrusion portion end surface approximately parallel to the base and which has a pair of first walls, the pair of first walls being disposed upright approximately perpendicular to the base from opposed sides of the protrusion portion end surface.

BRIEF DESCRIPTION OF THE DRAWINGS

FIGS. 4A to 4C illustrate ultrasonic bonding according to the first embodiment.

FIGS. 5A to 5C illustrate the ultrasonic bonding according to the first embodiment.

DESCRIPTION OF THE EMBODIMENTS

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A technique in WO 2013/105361 A performs ultrasonic bonding on a laminated body. It is difficult for this technique to sufficiently restrain cracks at a bonded portion material other than the laminated body. Additionally, protrusions formed on a processed surface of a chip possibly bite into a bonded body. In this case, components (components of the bonded body thrust by the bite by the protrusions: excess thickness) of a part of the bonded body bulge up around the protrusions by the bite. This inhibits the bite of the protrusions up to a predetermined depth. Further, an inclination is possibly present at a surface (a chip side surface) formed in a direction perpendicular to a vibration direction in ultrasonic vibration. In this case, the chip to which a load is applied vibrates during bonding. Therefore, the load and a friction occur between the chip side surface and the bonded body in contact with the chip side surface. Hence, the chip side surface and the bonded body are welded, possibly causing damage of the bonded body. Furthermore, when the chip is pulled away from the bonded body, the bonding between the bonded bodies is possibly torn off.

A technique in JP-T-2013-538128 relates to an ultrasonic welding treatment process using a torsion sonotrode. An application of this technique to a bonded portion material susceptible to torsion makes it difficult to sufficiently prevent cracks.

One object of the present disclosure is to provide an ultrasonic bonding jig, an ultrasonic bonding method, and a bonding structure that can achieve excellent bonding by restraining cracks at a bonded portion.

An ultrasonic bonding jig according to one aspect of the present disclosure (this bonding jig) includes: a base; and a protrusion portion which has a protrusion portion end surface approximately parallel to the base and which has a pair of first walls. The pair of first walls is disposed upright approximately perpendicular to the base from opposed sides of the protrusion portion end surface.

This bonding jig is, for example, used for the bonding of the metal plate with the base material. In this case, with this bonding jig, the entire protrusion portion end surface acts a pressing force to the metal plate without causing a high contact pressure to the metal plate. Therefore, the first walls perpendicular to the protrusion portion end surface provide a pressing effect by vibration. Accordingly, the protrusion bites into the metal plate with a small force. Consequently, a load to the metal plate lowers; therefore, cracks at the metal plate can be restrained.

In this bonding jig, the protrusion portion may further a pair of second walls. The pair of second walls is disposed upright approximately perpendicular to the base from other opposed sides of the protrusion portion end surface. According to this, the first walls and the second walls approximately perpendicular to the protrusion portion end surface provide a pressing effect by vibration. Accordingly, the protrusion bites into the metal plate with a small force. Consequently, a load to the metal plate lowers; therefore, cracks at the metal plate can be restrained.

The protrusion portion may further have a pair of second walls. The pair of second walls is inclined forming a fan shape from the other opposed sides of the protrusion portion end surface to the base. According to this, the pair of second walls inclined forming the fan shape to the base provides a wedge effect and a pressing effect. Therefore, efficient ultrasonic bonding can be achieved. Additionally, since the second walls are inclined forming the fan shape, the protrusion is formed so as to have a thin distal end and a thick base end. Consequently, breakage of the protrusion portion by the force generated by the vibration can restrained. Additionally, the protrusion portion easily bites into the metal plate.

This bonding jig may further include a protrusion group that includes a plurality of the protrusion portions arranged like islands, a flat portion among protrusions formed among the protrusion portions, and an annular flat portion that surrounds the protrusion group. According to this, the flat portion among protrusions and the annular flat portion surrounding the plurality of protrusions restrict a relative vibration between the protrusion group and the metal plate. Therefore, the cracks at the metal plate can be restrained.

A bonding structure according to one aspect of the present disclosure (this bonding structure) includes a bonding portion of a metal plate and a base material. The bonding portion has a recessed portion with a closed bottom on a surface of the metal plate. The recessed portion has a pair of walls approximately perpendicular to the surface of the metal plate. According to this bonding structure, the recessed portion with the closed bottom does not penetrate the metal plate. This restrains lowering the strength of the metal plate. Furthermore, the recessed portion is restricted by the pair of walls approximately perpendicular to the surface of the metal plate. Therefore, the size of the recessed portion can be restrained. Consequently, the cracks at the metal plate can be restrained.

This bonding structure may include a recessed portion group that includes a plurality of the recessed portions arranged like islands, a flat portion among recessed portions formed among the recessed portions, and an annular flat portion that surrounds the recessed portion group. According to this, the flat portion among recessed portions and the annular flat portion surrounding the plurality of recessed portions restrict the relative vibration between the recessed portion group and the metal plate. Consequently, the cracks at the metal plate can be restrained.

In this bonding structure, the metal plate may be a thin single-layer metal plate, and the base material may be a single-layer metal plate thicker than the metal plate. This ensures the ultrasonic bonding of the single-layer metal plates having different thicknesses together.

In the bonding structure of the present disclosure, the metal plate may be a flexible circuit board, and the base material may be a busbar. This ensures the ultrasonic bonding of the extremely thin flexible circuit board with the busbar far thicker than the flexible substrate.

The ultrasonic bonding method according to one aspect of the present disclosure (this bonding method) includes stacking a metal plate and a base material, pressing the metal plate to the base material by this bonding jig, and vibrating this bonding jig in a direction parallel to the first walls. This bonding method provides a pressing effect of the first walls approximately perpendicular to the protrusion portion end surface by vibration. Accordingly, the protrusion bites into the metal plate with a small force. Consequently, a load to the metal plate lowers; therefore, cracks at the metal plate can be restrained. Furthermore, the ultrasonic bonding of the metal plate with the base material can be excellently performed.

In this bonding method, the metal plate may be a thin single-layer metal plate, and the base material may be a single-layer metal plate thicker than the metal plate. Alternatively, the metal plate may be a flexible circuit board, and the base material may be a busbar.

The following describes embodiments of the ultrasonic bonding method, the ultrasonic bonding jig, and the bonding structure according to the present disclosure.

First Embodiment

The following describes an ultrasonic bonding method, an ultrasonic bonding jig, and a bonding structure according to the first embodiment with reference to FIGS. 1 to 4C.

Figure 1:
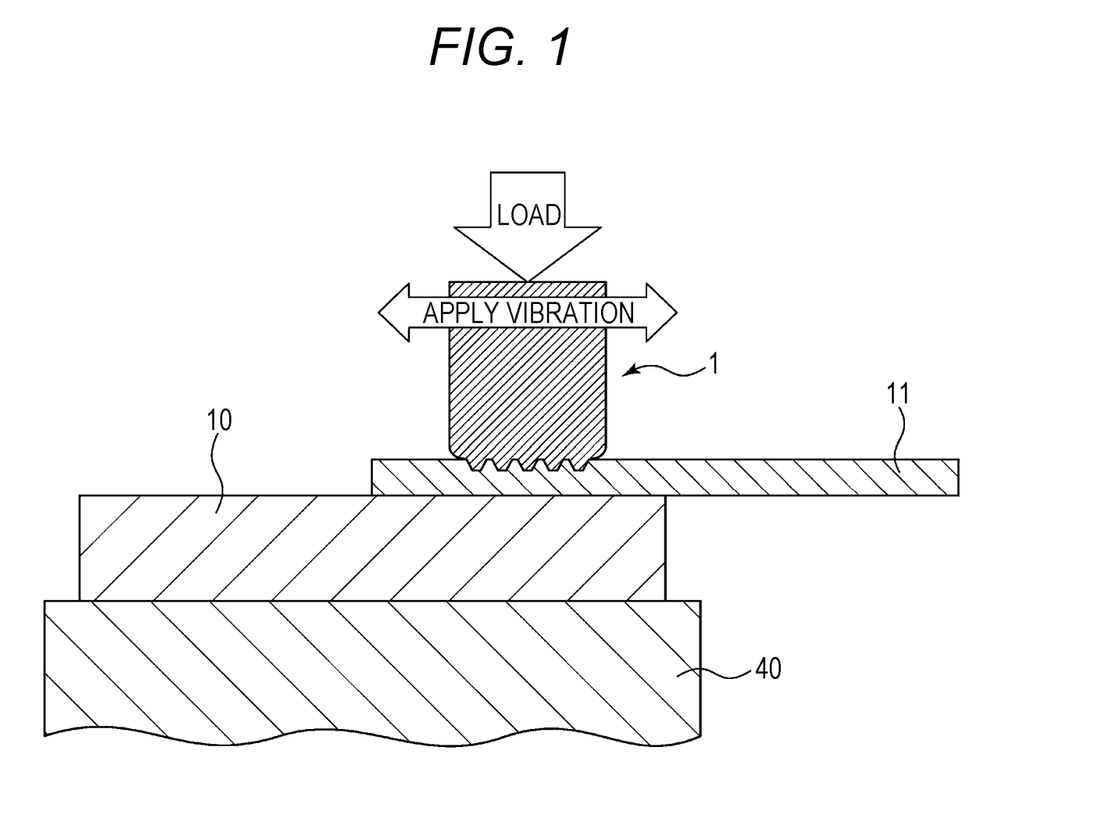
FIG. 1 illustrates a principle diagram of ultrasonic bonding according to a first embodiment.

FIG. 1 is a principle diagram of ultrasonic bonding. A copper foil 11 and a busbar 10 are stacked and are placed to be fixed on a support table 40. The copper foil 11 is pressed to the bus bar 10 by a head 1. In this state, ultrasonic vibration is horizontally performed on the head 1 at a predetermined frequency. Thus, the pressing force and the ultrasonic vibration by the head 1 remove an oxide and another dirt on metal surfaces from contact surfaces of the copper foil 11 and the busbar 10. Furthermore, metal atoms are bonded together on the above-described contact surfaces by friction heating caused by the pressing force and the ultrasonic vibration. The copper foil 11 is equivalent to one example of a metal plate according to the present disclosure and may be a thin single-layer metal plate. The busbar 10 is equivalent to one example of a base material according to the present disclosure and may be a single-layer metal plate thicker than the metal plate.

The following describes the head 1 used for the ultrasonic bonding of the present embodiment. The head 1 is equivalent to one example of the ultrasonic bonding jig according to the present disclosure.

As illustrated in FIG. 2 and FIGS. 3A to 3C, the head 1 has a base 1a formed of a flat surface at the distal end. This base 1a includes a protrusion group 2, a flat portion among protrusions 4, an annular flat portion 5, and an annular escaping portion 6. The protrusion group 2 has a plurality of protrusion portions 3 arranged like islands. The flat portion among protrusions 4 has a flat surface disposed between the adjacent protrusion portions 3. The annular flat portion 5 is disposed across the whole circumference outside the protrusion group 2. The annular flat portion 5 has a flat surface with a radial width e and without a protrusion. The annular escaping portion 6 is formed across the whole circumference outside the annular flat portion 5.

Figure 3A:
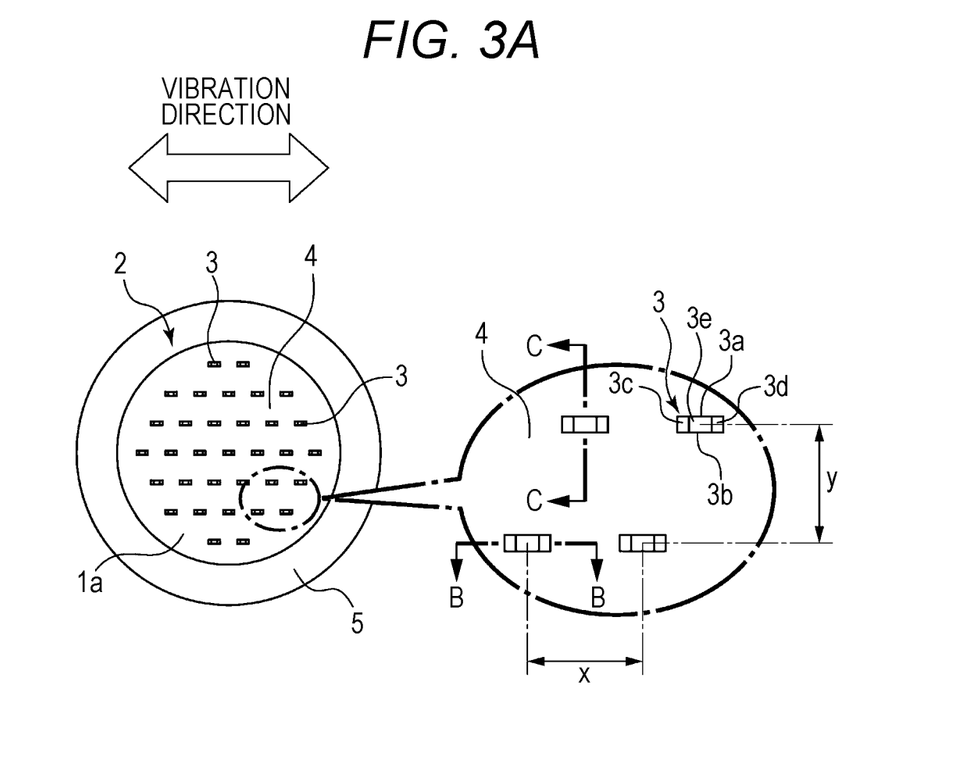
FIG. 3A is a view on arrow A in FIG. 2.
Figure 3B:
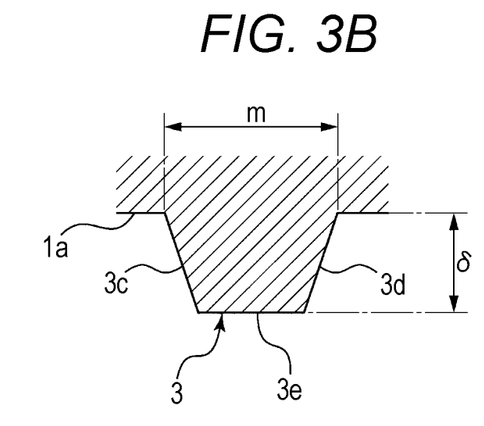
FIG. 3B illustrates a B-B cross-sectional surface of FIG. 3A illustrating protrusion portions.
Figure 3C:
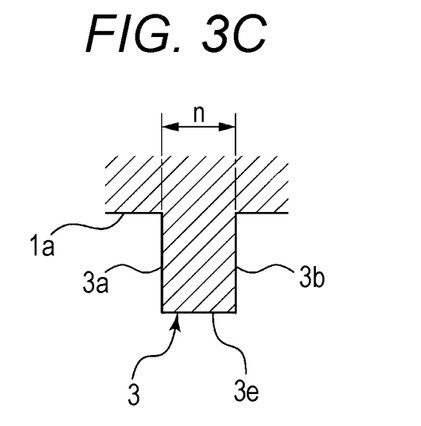
FIG. 3C illustrates a C-C cross-sectional surface of FIG. 3A illustrating protrusion portions.

As illustrated in FIGS. 3A to 3C, the protrusion portion 3 has a rectangular bottom surface having bottom side lengths m and n and has a height δ. The cross-sectional surface of the protrusion portion 3 along the bottom side with the length m has a trapezoidal shape. Meanwhile, the cross-sectional surface of the protrusion portion 3 along the bottom side with the length n has a rectangular. That is, the protrusion portion 3 has a trapezoidal pillar shape. The protrusion portions 3 can provide a sufficient sandwiching force in the thickness direction to the copper foil 11 together with the support table 40 and has rigidity by which the protrusion portions 3 themselves are less likely to deform by the force caused by ultrasonic vibration applied from the head 1. The following sometimes designates the bottom side with the length m of the protrusion portion 3 as the bottom side m (or the long side m). Furthermore, the following sometimes designates the bottom side with the length n of the protrusion portion 3 as the bottom side n (or the short side n).

The respective protrusion portions 3 included in the protrusion group 2, for example, are configured such that the direction of the long side m or the short side n becomes perpendicular to (approximately perpendicular to) the direction of the ultrasonic vibration. This ensures excellent transmission of the force by the ultrasonic vibration applied from the head 1 to the copper foil 11 and the busbar 10. Furthermore, the cracks at the copper foil 11 can be restrained. Additionally, a lateral direction interval x and a lengthwise direction interval y of the plurality of protrusion portions 3 are configured to have a sufficient length. Therefore, the flat portion among protrusions 4 is formed among the protrusion portions 3. By disposing the flat portion among protrusions 4 between the adjacent protrusion portions 3, when the protrusion group 2 bites into the copper foil 11, the flat portion among protrusions 4 contacts the copper foil 11 and acts as a stopper. Consequently, the excessive bite can be restrained. The flat portion among protrusions 4 contacts the copper foil 11 to restrain a relative vibration between the protrusion portions 3 and the copper foil 11. Hence, the cracks at the copper foil 11 can be restrained. The plurality of protrusion portions 3 illustrated in FIGS. 3A to 3C is disposed into a houndstooth pattern. Instead of this, the plurality of protrusion portions 3 may be disposed into a grid pattern.

As illustrated in FIG. 2 and FIGS. 3A to 3C, the annular flat portion 5 is disposed outside the protrusion group 2. The annular flat portion 5 is disposed across the whole circumference outside the protrusion group 2. The annular flat portion 5 has the flat surface with the radial width e and without a protrusion. The annular flat portion 5 may be formed to be at a height level identical to the flat portion among protrusions 4. When the copper foil 11 is sandwiched between the protrusion group 2 and the support table 40, the annular flat portion 5 can collaborate with the flat portion among protrusions 4 to restrain a relative displacement between the protrusion group 2 and the copper foil 11. That is, the flat portion among protrusions 4 can press the copper foil 11 between the adjacent protrusion portions 3 and restrain the relative displacement at these parts. Furthermore, the annular flat portion 5 can restrain the relative displacement between the protrusion portions 3 disposed at the outermost periphery of the protrusion group 2 and the copper foil 11. That is, the flat portion among protrusions 4 and the annular flat portion 5 can press the copper foil 11 across the entire surface of the base 1a of the head 1. This ensures efficiently restraining the relative displacement between the head 1 and the copper foil 11. Consequently, the cracks at the copper foil 11 can be restrained.

Figure 2:
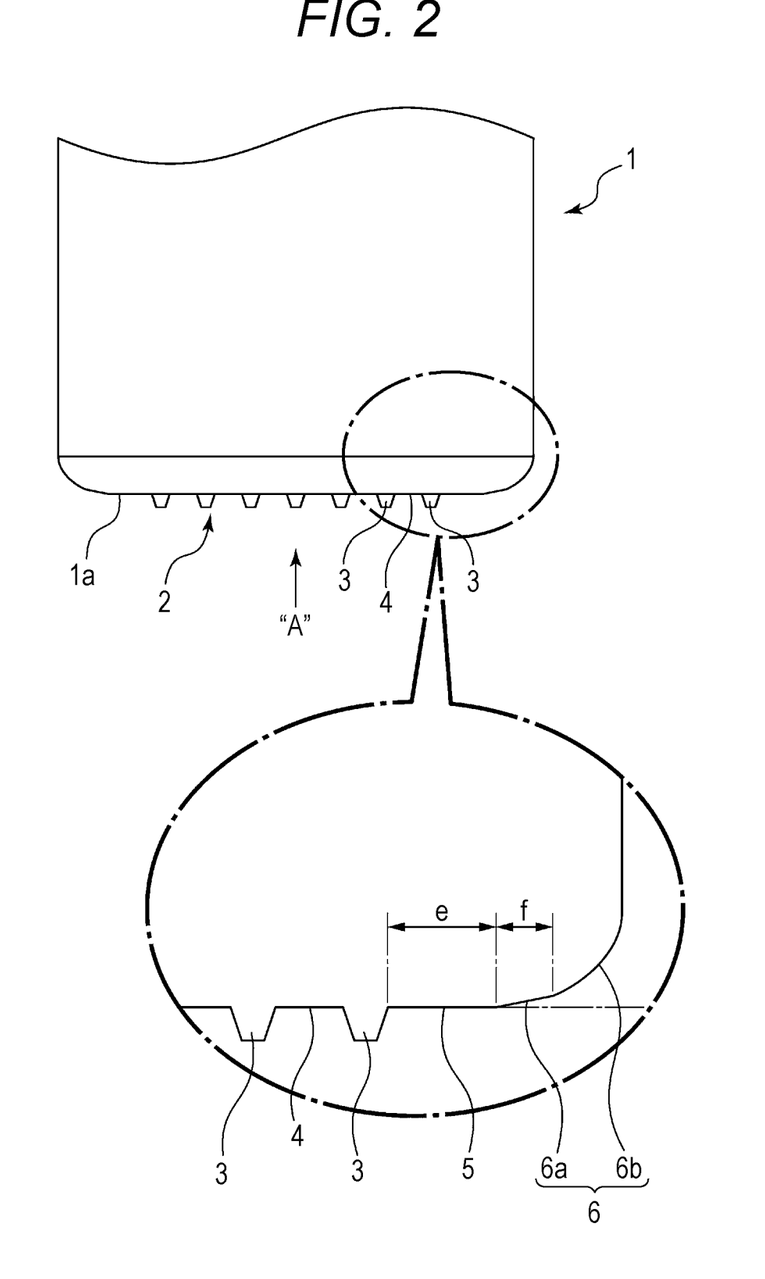
FIG. 2 is a side view illustrating a distal end portion of a head according to the first embodiment.

Furthermore, the annular escaping portion 6 is disposed across the whole circumference outside the annular flat portion 5. When the copper foil 11 and the busbar 10 are sandwiched between the protrusion group 2 and the support table 40, concave deformation slightly occurs at the copper foil 11 by pressing force from the protrusion group 2. Meanwhile, since the outside of the annular flat portion 5 is not pressed by the protrusion group 2, the concave deformation hardly occurs at the outside. Therefore, the shape (the surface shape) of the copper foil 11 sharply changes at inner and outer regions of the annular flat portion 5. This possibly causes the cracks at the copper foil 11. Hence, as illustrated in FIG. 2, the annular escaping portion 6 is disposed to reduce the sharp deformation of the copper foil 11 at the inner and outer regions of the annular flat portion 5.

The annular escaping portion 6 includes an inclined portion 6a formed so as to be smoothly continuous with the annular flat portion 5 and a curved surface 6b. The inclined portion 6a is an inclined surface inclined by around 2° to 5° with respect to the annular flat portion 5. The curved surface 6b is a curved surface smoothly continuous with the inclined portion 6a. The annular escaping portion 6 with such shape reduces the sharp deformation of the copper foil 11 at the outer peripheral edge of the annular flat portion 5, restraining the cracks at the copper foil 11. The annular escaping portion 6 includes the inclined portion 6a and the curved surface 6b. Instead of this, the annular escaping portion 6 may be configured by only the inclined portion 6a or only the curved surface 6b.

Next, the following describes the protrusion portions 3 with reference to FIGS. 3A to 3C and FIGS. 4A to 4C. The protrusion portion 3 has a protrusion portion end surface 3e, first walls 3a and 3b, and second walls 3c and 3d. The protrusion portion end surface 3e is approximately parallel to the base 1a of the head 1. The first walls 3a and 3h extend from the protrusion portion end surface 3e to the base 1a approximately perpendicular to the base 1a. That is, the pair of first walls 3a and 3b is disposed upright approximately perpendicular to the base 1a from the opposed sides of the protrusion portion end surface 3e. The first walls 3a and 3b are disposed opposed to one another. The second walls 3c and 3d are adjacent to the first walls 3a and 3b and extend so as to be inclined forming a fan shape from the protrusion portion end surface 3e to the base 1a. That is, the pair of second walls 3c and 3d is inclined forming the fan shape from the other opposed sides of the protrusion portion end surface 3e to the base 1a. The second walls 3c and 3d are disposed opposed to one another. The height δ of the protrusion portion 3 is configured to be smaller than a thickness h of the copper foil 11. This restrains the protrusion portions 3 penetrating the copper foil 11 when the copper foil 11 and the busbar 10 are sandwiched between the protrusion group 2 and the support table 40.

Figure 4A:
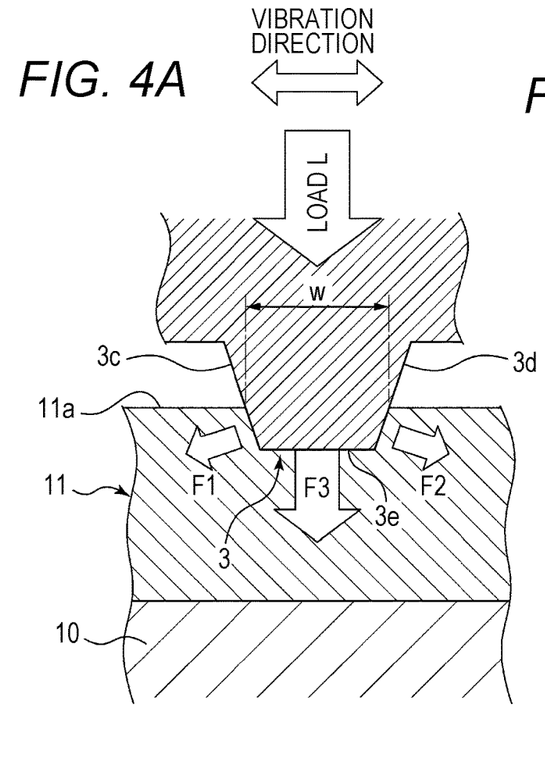
FIG. 4A illustrates a state where the protrusion portion presses a copper foil while this protrusion portion is vibrated to perform the ultrasonic bonding of the copper foil with a busbar.
Figure 4B:
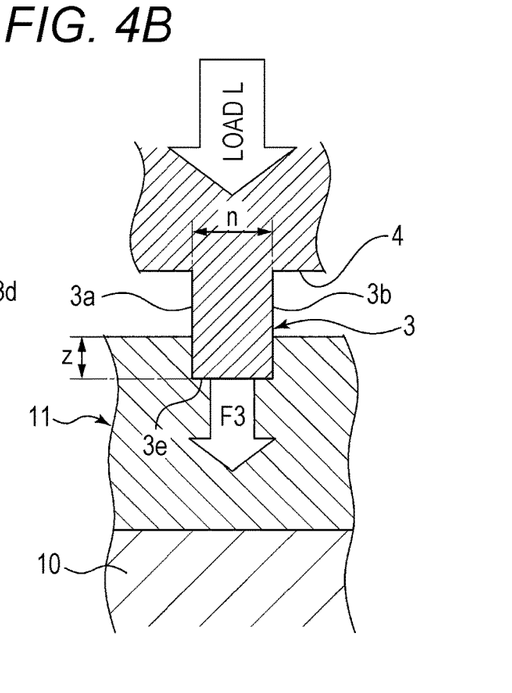
FIG. 4B is a right side cross-sectional view of FIG. 4A.
Figure 4C:
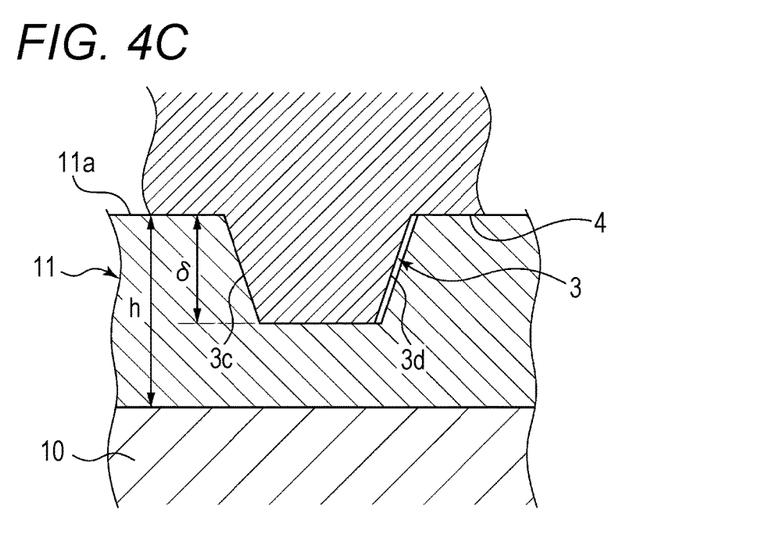
FIG. 4C illustrates a bonding portion after the ultrasonic bonding.

FIG. 4A illustrates a cross-sectional view of the protrusion portion 3 in a direction (a direction of the long side m) parallel to the longitudinal direction of the bottom surface. FIG. 4B illustrates a cross-sectional view of the protrusion portion 3 in a direction (a direction of the short side n) perpendicular to the longitudinal direction of the bottom surface. The protrusion portion 3 largely vibrates along the direction of the long side m (that is, the direction parallel to the first walls 3a and 3b). Meanwhile, the protrusion portion 3 hardly vibrates in the direction of the short side n (that is, the direction perpendicular to the first walls 3a and 3b). The following sometimes designates the direction of the long side m of the protrusion portion 3, that is, the direction in which the protrusion portion 3 largely vibrates as a "vibration direction." Furthermore, the following sometimes designates the direction of the short side n of the protrusion portion 3, that is, the direction in which the protrusion portion 3 hardly vibrates as a "vibration right-angled direction."

A load L and the vibration applied to the protrusion portions 3 cause forces F1 and F2 of the protrusion portions 3 generated by the pressing force and a wedge effect to act in the vibration direction. Therefore, the protrusion portions 3 gradually bite into the copper foil 11 by the vibration on the cross-sectional surface (FIG. 4A) in the vibration direction, and a width w and a depth z of a recessed portion gradually increases. Meanwhile, the pressing force by the protrusion portions 3 acts on the copper foil 11 mainly in the vibration right-angled direction. Accordingly, a width n of a recessed portion on the copper foil 11 is constant on the cross-sectional surface (FIG. 4B) in the vibration right-angled direction, and the depth z of the recessed portion gradually deepens. This restrains bending of the protrusion portions 3 due to the force caused by the vibration. Further, the protrusion portions 3 easily bite into the copper foil 11. On the cross-sectional surface in the vibration right-angled direction, the protrusion portions 3 do not have an inclined surface like the second walls. Accordingly, even if areas of the end surfaces of the protrusion portions 3 are identical, a volume of the protrusion portions 3 biting into the copper foil 11 can be decreased by the amount. Accordingly, an amount of a component to be thrust (excess thickness) of the copper foil 11 can be reduced. Therefore, the protrusion portions 3 can bit into the copper foil 11 up to the predetermined depth without hindrance by the excess thickness. Consequently, the bonding strength can be increased. Further, since there is no inclined surface like the second walls in the vibration right-angled direction, welding of the side surfaces of the protrusion portions 3 with the copper foil 11 can be restrained. The second walls 3c and 3d on the cross-sectional surface taken along B-B in FIG. 3B are inclined with respect to the base 1a. Meanwhile, the second walls 3c and 3d may also be formed so as to extend approximately perpendicular to the base 1a.

As illustrated in FIGS. 4A and 4B, the protrusion portion end surface 3e of the protrusion portion 3 is formed as a flat surface approximately parallel to the base 1a. Therefore, a load F3 used for the ultrasonic bonding can be provided to the surface of the copper foil 11 by the entire protrusion portion end surface 3e. Consequently, the ultrasonic vibration allows efficiently removing an oxide and another dirt from the metal surface and mutual bonding of the metal atoms. Additionally, the load F3 is applied to the surface of the copper foil 11 by the entire protrusion portion end surface 3e. This ensures restraining an average surface pressure, thereby allowing restraining the cracks at the copper foil 11. Furthermore, the copper foil 11 and the busbar 10 are sandwiched between the protrusion group 2 (the protrusion portions 3), which do not penetrate the copper foil 11, and the support table 40. Accordingly, the relative vibration between the copper foil 11 and the busbar 10 can be restricted without lowering the strength of the copper foil 11. Consequently, the cracks at the copper foil 11 can be restrained.

The following describes steps of the ultrasonic bonding. First, the copper foil 11 and the busbar 10 are arranged between the support table 40 and the head 1 (an arranging step). Next, the copper foil 11 and the busbar 10 are sandwiched between the head 1 and the support table 40 in the thickness direction (a sandwiching step). Subsequently, the ultrasonic vibration is performed on the head 1. Accordingly, the pressing force and the ultrasonic vibration from the head 1 act on the contact surfaces between the copper foil 11 and the busbar 10 via the protrusion group 2. Consequently, an oxide and another dirt are removed from the surfaces of the copper foil 11 and the busbar 10. Furthermore, friction heating caused by the pressing force and the ultrasonic vibration performs the bonding between metal atoms (a bonding step), and then the ultrasonic bonding is completed.

Figure 5A:
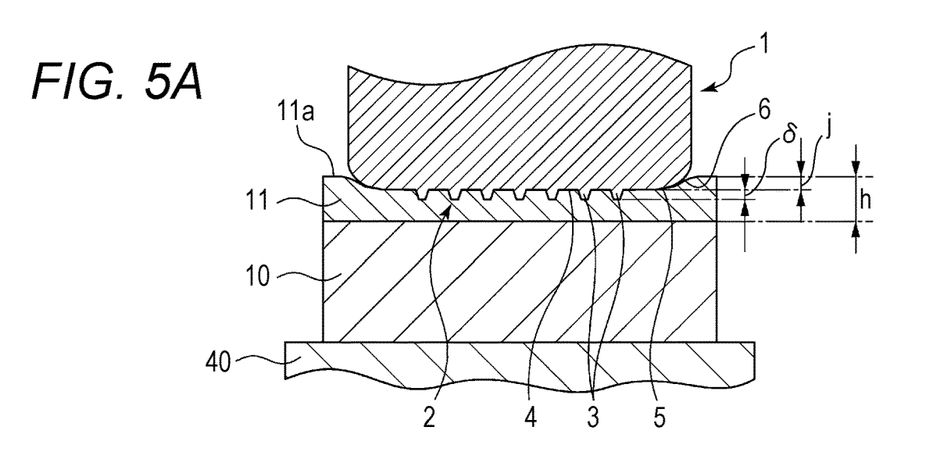
FIG. 5A illustrates a state where the ultrasonic bonding is performed on the copper foil with the busbar.
Figure 5B:
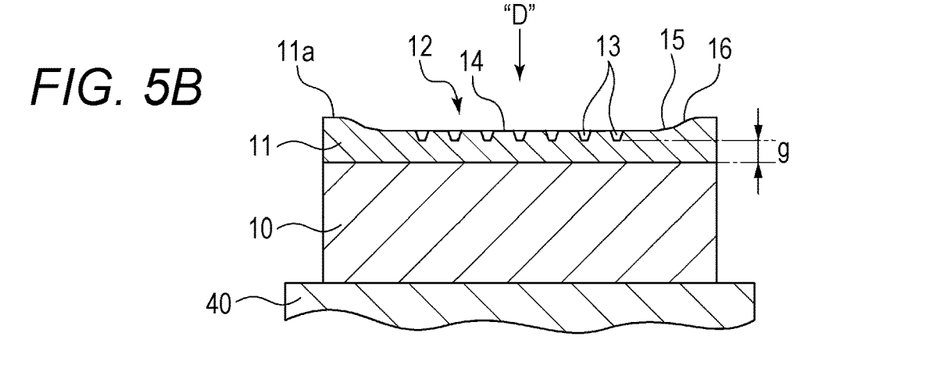
FIG. 5B illustrates the bonding portion after the ultrasonic bonding.

Here, as illustrated in FIG. 5A, the height $\delta$ of the protrusion portion 3 is configured to be smaller than the thickness h of the copper foil 11. Therefore, when the copper foil 11 is sandwiched between the protrusion group 2 and the support table 40, the protrusion portions 3 do not penetrate the copper foil 11. FIG. 5B illustrates a state where the bonding of the copper foil 11 with the busbar 10 is completed. As illustrated in FIG. 5B, distal ends of recessed portions 13 formed on the copper foil 11 have non-penetrating portions g. This restrains lowering the strength of the copper foil 11. Accordingly, the contact portions between the protrusion group 2 and the copper foil 11 are secured, ensuring the excellent ultrasonic bonding.

Additionally, the flat portion among protrusions 4 and the annular flat portion 5 are formed to be at the identical height level. When the copper foil 11 and the busbar 10 are sandwiched between the protrusion group 2 and the support table 40, the flat portion among protrusions 4 can collaborate with the annular flat portion 5 and restrain the relative displacement between the protrusion group 2 and the copper foil 11. The flat portion among protrusions 4 contacts the surface of the copper foil 11 and mainly restrains the relative displacement between the protrusion group 2 (the protrusion portions 3) and the copper foil 11 between the protrusion portions 3. The annular flat portion 5 contacts the outside of the protrusion group 2 and mainly restrains the relative displacement between the protrusion portions 3 disposed at the outermost periphery of the protrusion group 2 and the copper foil 11. This ensures efficiently restraining the relative displacement between the protrusion portions 3 and the copper foil 11 across the entire surface of the protrusion group 2. Consequently, the cracks at the copper foil 11 can be restrained.

Further, as illustrated in FIG. 5A, when the copper foil 11 and the busbar 10 are sandwiched between the protrusion group 2 and the support table 40, the surface of the copper foil 11 sinks by a depth j. At this time, at the proximity of the annular flat portion 5, the crack is likely to occur at the copper foil 11 at boundaries between the sunk parts and parts not sunk on a surface 11a of the copper foil 11. Therefore, the annular escaping portion 6 is disposed at the outer peripheral edge of the annular flat portion 5, This annular escaping portion 6 allows reducing the sharp deformation of the copper foil 11 at the outer peripheral edge of the annular flat portion 5. Consequently, the cracks at the copper foil 11 can be restrained.

Figure 5C:
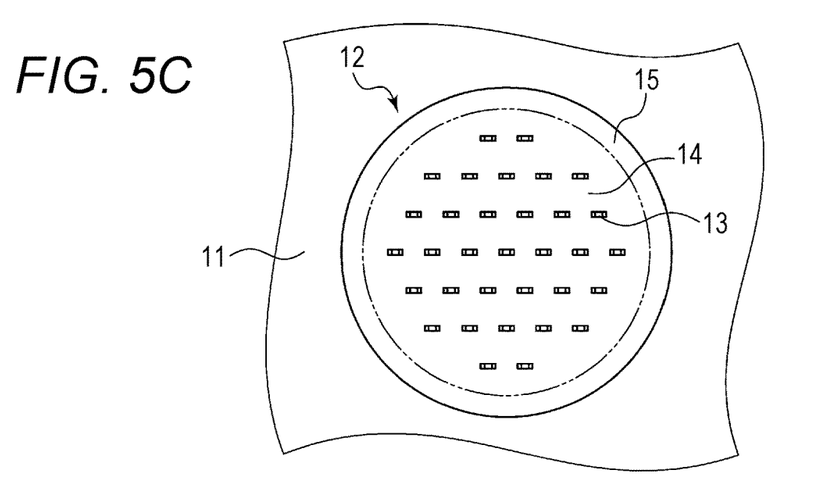
FIG. 5C is a view viewed from an arrow D in FIG. 5B.

As illustrated in FIGS. 5A to 5C, a bonding portion 12 is formed on the surface of the copper foil 11 pressed by the head 1. The bonding portion 12 is slightly sunk with respect to the surface 11a of the copper foil 11. The head 1 forms a recessed portion group including the plurality of recessed portions 13 arranged (formed) like the islands, a flat portion among recessed portions 14, an annular flat portion 15, and an annular inclined portion 16 on the bonding portion 12 (the copper foil 11). The flat portion among recessed portions 14 is formed between the adjacent recessed portions 13. The annular flat portion 15 surrounds the outside of the recessed portion group across the whole circumference. Recessed portions are not formed at the annular flat portion 15. The annular inclined portion 16 surrounds the outside of the annular flat portion 15 across the whole circumference. The bonding portion 12 having such shape ensures restraining the cracks at the copper foil 11 and also ensures the excellent ultrasonic bonding of the copper foil 11 with the busbar 10.

Figure 6A:
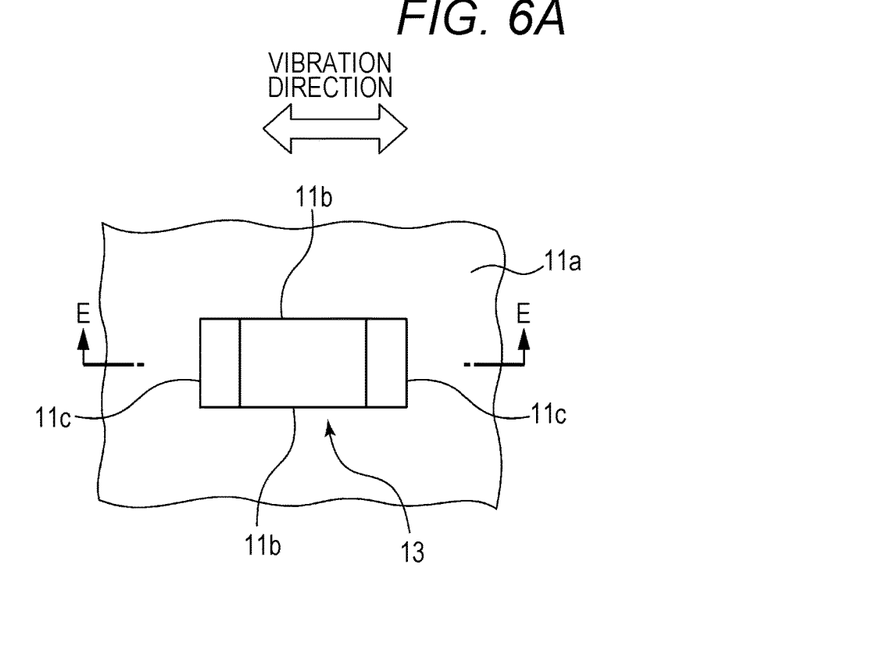
FIG. 6A illustrates a recessed portion formed by the ultrasonic bonding according to the first embodiment.
Figure 6B:
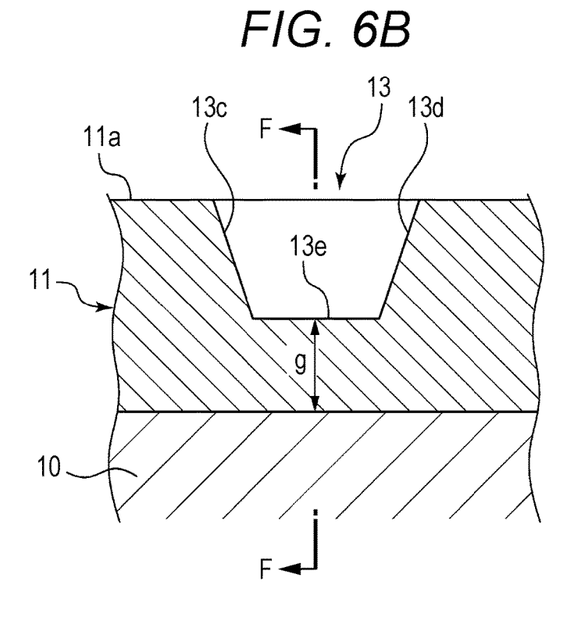
FIG. 6B illustrates an E-E cross-sectional surface of FIG. 6A.
Figure 6C:
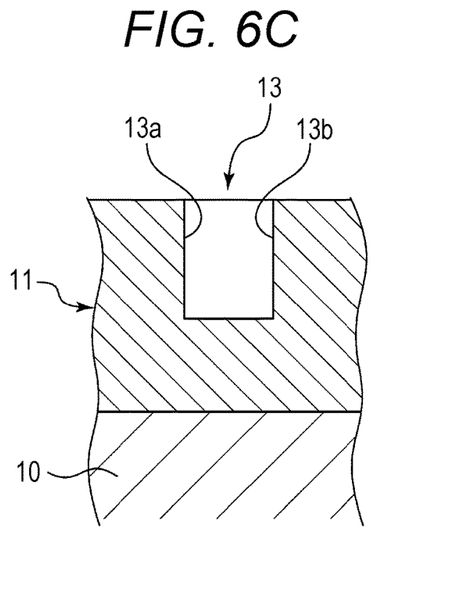
FIG. 6C illustrates an F-F cross-sectional surface of FIG. 6A.

As illustrated in FIGS. 6A to 6C, the recessed portion 13 has a pair of walls 13a and 13b and a pair of inclined walls 13c and 13d. The pair of walls 13a and 13b is approximately perpendicular to the surface 11a of the copper foil 11. The pair of inclined walls 13c and 13d is inclined with respect to the surface 11a of the metal plate (the copper foil 11). The walls 13a and 13b of the recessed portion 13 are formed by the pressing effect that the pressing force by the protrusion portions 3 causes the protrusion portions 3 to bite into the copper foil 11. Therefore, an interval between sides 11b and 11b parallel to the longitudinal direction at an opening of the recessed portion 13 and an interval between the pair of walls 13a and 13b of recessed portion 13 can be formed approximately identical to the short side dimension n of the bottom surface of the protrusion portion 3. This allows restraining the large recessed portions 13, thereby ensuring restraining the low strength of the copper foil 11. Meanwhile, the inclined walls 13c and 13d of the recessed portions 13 are formed by the wedge effect and the pressing effect of the second walls 3c and 3d of the protrusion portions 3 and the vibration of the protrusion portions 3. Accordingly, the inclined walls 13c and 13d of the recessed portion 13 are formed to be larger to the outside with respect to the second walls 3c and 3d of the protrusion portion 3.

Thus, the bonding portion 12 has the recessed portions 13 with the closed bottoms on the surface of the copper foil 11. Furthermore, the recessed portion 13 includes the pair of walls 13a and 13b, which is approximately perpendicular to the surface of the copper foil 11. That is, among the walls 13a, 13b. 13c, and 13d of the recessed portion 13, the walls 13a and 13b are mainly formed by a cutting effect of the first walls 3a and 3b of the protrusion portion 3. Therefore, the force acting on the copper foil 11 from the protrusion portions 3 can be reduced. Consequently, the cracks at the copper foil 11 can be restrained. The first walls 3a and 3b and the second walls 3c and 3d of the protrusion portions 3 can be configured to be approximately perpendicular to the base 1a of the head 1. In this case as well, the cutting effect of the protrusion portion 3 allows the walls 13a, 13b, 13c, and 13d of the recessed portion 13 to be formed approximately perpendicular to the surface 11a of the copper foil 11. Additionally, the bonding portion 12 includes a recessed portion group, which includes the plurality of recessed portions 13 arranged like islands, a flat portion among recessed portions 14, which is formed among the recessed portions 13, and an annular flat portion 15, which surrounds the recessed portion group.

Second Embodiment

Figure 7:
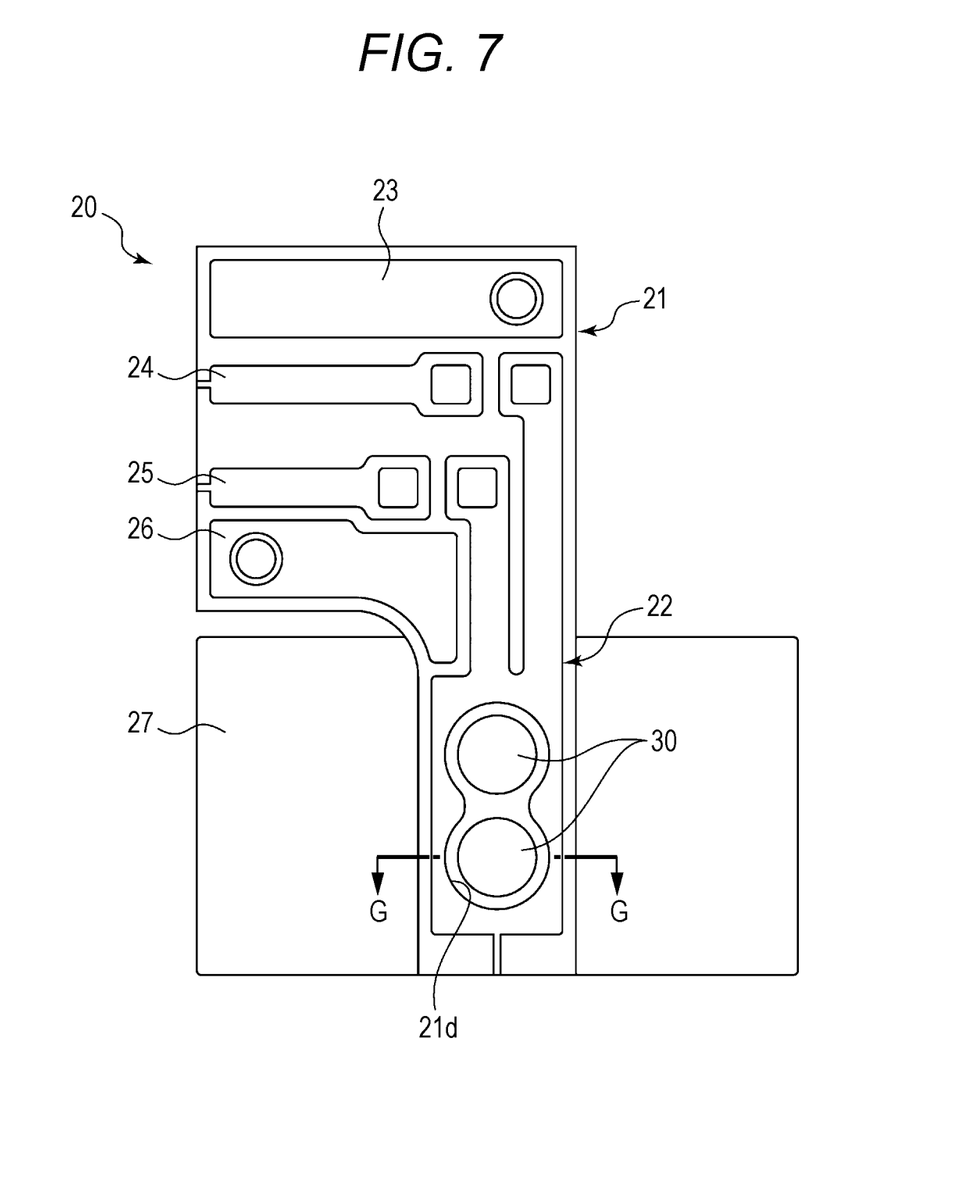
FIG. 7 is a drawing describing ultrasonic bonding of a flexible circuit board with a busbar according to a second embodiment.
Figure 8:
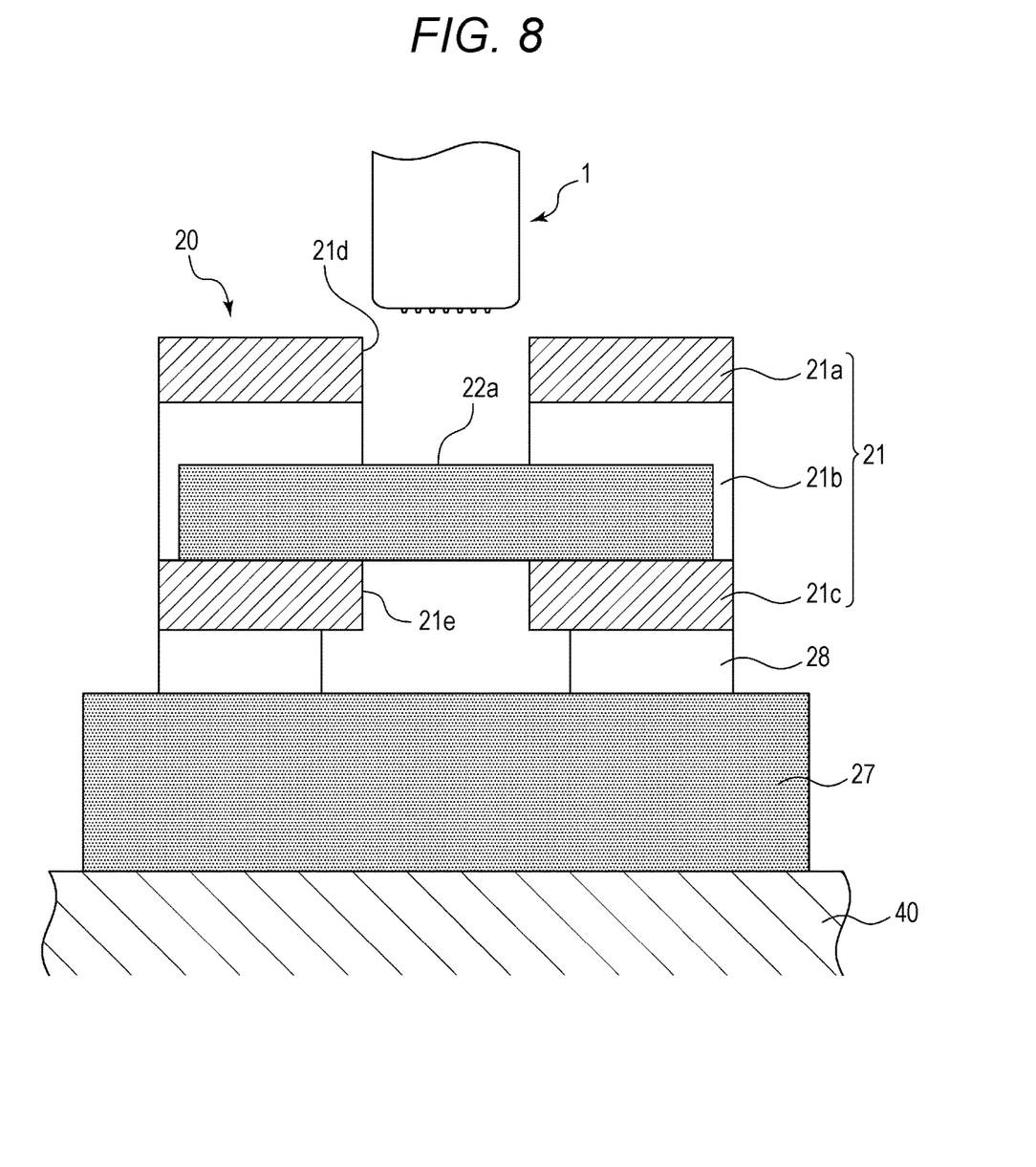
FIG. 8 illustrates a cross-sectional surface taken along G-G in FIG. 7.

The following describes an ultrasonic bonding method, an ultrasonic bonding jig, and a bonding structure according to the second embodiment with reference to FIGS. 7 and 8. Like reference numerals designate identical configurations to the first embodiment, and therefore such configurations will not be further elaborated here.

The ultrasonic bonding method and the bonding structure of the second embodiment bond a flexible circuit board 20 and a bulbar 27 together by formation of bonding portions 30 through ultrasonic bonding. FIG. 7 illustrates the two bonding portions 30. However, the number of bonding portions 30 is not limited to the two locations. For example, the bonding portions 30 may be disposed at one, three, or four or more locations according to a magnitude of a current flowing through the flexible circuit board 20. The flexible circuit board 20 is equivalent to one example of the metal plate according to the present disclosure or a thin metal plate. The busbar 27 is equivalent to one example of the base material according to the present disclosure.

As illustrated in FIGS. 7 and 8, the flexible circuit board 20 includes copper foil portions 22, 23, 24, 25, and 26 constituting an electric circuit and a base film 21 that insulates these copper foil portions 22, 23, 24, 25, and 26. The copper foil portions 22, 23, 24, 25, and 26 are equivalent to one example of the metal foil according to the present disclosure. The flexible circuit board 20 has an electric circuit pattern that has already been formed on the base film 21. Therefore, the use of the flexible circuit board 20 allows labor-saving of wiring work. Since the flexible circuit board 20 is extremely thin and can be freely bent, the flexible circuit board 20 can be arranged at a slight gap in the device. Thus, the flexible circuit board 20 can be freely bent for use. Hence, external force acts on the bonding portions 30 from various directions.

The base film 21 of the flexible circuit board 20 is, for example, made of polyimide with a thickness around 25 μm. The base film 21 includes a base material 21c and a cover material 21a. The copper foil portions 22, 23, 24, 25, and 26 of the flexible circuit board 20 are formed as follows. First, a copper foil with a thickness around 35 μm is adhered on the base material 21c with adhesive 21b. An application of a printing technique to this copper foil forms the copper foil portions 22, 23, 24, 25, and 26, which constitute the desired electric circuit pattern, on the base material 21c. Furthermore, as necessary, the cover material 21a is adhered on the copper foil portions 22, 23, 24, 25, and 26. This cover material 21a insulates the copper foil portions 22, 23, 24, 25, and 26 constituting the electric circuit and protects and reinforces the extremely thin copper foil portions 22, 23, 24, 25, and 26. The cover material 21a can be omitted.

The following describes an example of the ultrasonic bonding between the copper foil portion 22 and the busbar 27. As illustrated in FIG. 8, the busbar 27 is a single-layer metal plate such as a copper plate with a thickness around 1.5 mm. Meanwhile, the copper foil is a single-layer thin plate metal with a thickness around 35 μm. That is, the thicknesses of the two members are significantly different. Typically, stably bonding a large amount of two metal members having significantly different thicknesses by automated lines was difficult.

As illustrated in FIG. 8, the base material 21c, which covers the copper foil portion 22, and the cover material 21a of the flexible circuit board 20 has openings 21d and 21e. Consequently, a copper foil exposed portion 22a (an exposed part of the copper foil portion 22) is formed in the flexible circuit board 20. Excluding the copper foil exposed portion 22a, the base material 21c of the flexible circuit board 20 and the busbar 27 are fixed with an adhesive portion 28. The head 1 is brought into contact with the copper foil exposed portion 22a of the flexible circuit board 20. The copper foil exposed portion 22a and the busbar 27 are sandwiched between the head 1 and the support table 40. Performing the ultrasonic vibration on the head 1 in this state forms the bonding portions 30 at the copper foil exposed portion 22a and the busbar 27, which are sandwiched between the head 1 and the support table 40. These bonding portions 30 electrically bond the copper foil portion 22 of the flexible circuit board 20 and the busbar 27 together.

Here, the following further describes a sandwiching step where the copper foil exposed portion 22a and the busbar 27 are sandwiched between the head 1 and the support table 40. As illustrated in FIG. 8, the base material 21c and the adhesive portion 28 form a clearance between the copper foil exposed portion 22a of the copper foil portion 22 and the busbar 27. Therefore, the sandwiching step significantly deforms the thin copper foil portion 22 and large stress is applied to the thin copper foil portion 22. Hence, a crack is likely to occur in the copper foil portion 22 (the copper foil exposed portion 22a). Meanwhile, the adhesive portion 28 is disposed between the base material 21c of the flexible circuit board 20 and the busbar 27. Therefore, the adhesive portion 28 absorbs the large stress occurred in the copper foil portion 22 in the sandwiching step. Consequently, an influence of strain in the sandwiching step can be lowered. Additionally, the peripheral areas of the ultrasonic bonding portions (the bonding portions 30) are fixed with the adhesive portion 28. Accordingly, even after welding, external force acting on the bonding portions 30 can be dispersed by the adhesive portion 28. Consequently, a load applied to the bonding portions 30 can be lowered.

With the present embodiment, the bonding portions 30 formed by the head 1 includes in the copper foil exposed portion 22a the recessed portion group, which includes the plurality of recessed portions formed like the islands, the flat portion among recessed portions, which are formed between the adjacent recessed portions, the annular flat portion, which surrounds the outside of the recessed portion group across the whole circumference and does not have a recessed portion, and the annular inclined portion, which surrounds the outside of the annular flat portion across the whole circumference. Accordingly, the cracks at the copper foil portion 22 can be restrained. Furthermore, the adhesive portion 28 between the base material 21c of the flexible circuit board 20 and the busbar 27 absorb the strain in the sandwiching step. Therefore, the cracks at the copper foil portion 22 can be efficiently restrained.

In the above, the embodiments of the present disclosure have been described with the drawings. The specific configuration of the technique in the present disclosure is not limited to these embodiments. The above-described embodiments may be changed, and other configurations or steps may be added to the above-described embodiments, in a range without departing from the gist of the technique in the present disclosure.

The embodiments of the present disclosure may also be the following first to fourth ultrasonic bonding jigs, first to fourth bonding structures, and first to third ultrasonic bonding methods.

The first ultrasonic bonding jig is a jig for ultrasonic bonding of a metal plate with a base material by pressing a head to the metal plate while vibrating the head. The head includes: a base formed to be flat; and a protrusion portion which at least has a protrusion portion end surface approximately parallel to the base and which at least has a pair of first walls. The pair of first walls is disposed upright approximately perpendicular to the base from opposed sides of the protrusion portion end surface.

In the second ultrasonic bonding jig according to the first ultrasonic bonding jig, the protrusion portion further has a pair of second walls. The pair of second walls is disposed upright approximately perpendicular to the base from other opposed sides of the protrusion portion end surface.

In the third ultrasonic bonding jig according to the first ultrasonic bonding jig, the protrusion portion further has a pair of second walls. The pair of second walls is inclined forming a fan shape from the other opposed sides of the protrusion portion end surface to the base.

In the fourth ultrasonic bonding jig according to any one of the first to the third ultrasonic bonding jigs, the head further includes a protrusion group where the protrusion portions are plurally arranged and formed like islands, a flat portion among protrusions among the protrusion portions, and an annular flat portion that surrounds the protrusion group.

The first bonding structure is a bonding structure that bonds a metal plate with a base material together. The first bonding structure at least has a recessed portion with a closed bottom with a depth not penetrating the metal plate on a surface of the metal plate and a pair of walls of the recessed portion approximately perpendicular to the surface of the metal plate.

The second bonding structure according to the first bonding structure includes a recessed portion group where the recessed portions are plurally arranged and formed like islands, a flat portion among recessed portions among the recessed portions, and an annular flat portion that surrounds the recessed portion group. In the third bonding structure according to the first or the second bonding structure, the metal plate is a thin single-layer metal plate. The base material is a single-layer metal plate thicker than the metal plate.

In the fourth bonding structure according to any one of the first to the third bonding structures, the metal plate is a flexible circuit board, and the base material is a busbar.

The first ultrasonic bonding method is an ultrasonic bonding method that bonds a metal plate with a base material together using any one of the first to the fourth ultrasonic bonding jigs and vibrates the head in a direction parallel to the first walls.

In the second ultrasonic bonding method according to the first ultrasonic bonding method, the metal plate is a thin single-layer metal plate. The base material is a single-layer metal plate thicker than the metal plate.

In the third ultrasonic bonding method according to the first or the second ultrasonic bonding method, the metal plate is a flexible circuit board, and the base material is a busbar.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:
1. An ultrasonic bonding jig comprising:
  a base; and
  a protrusion portion including a protrusion portion end surface approximately parallel to the base, a pair of opposing first walls being disposed upright approximately perpendicular to the base from opposed sides of the protrusion portion end surface, and a pair of opposing second walls each disposed to form an inclined surface that extends from the protrusion portion end surface to the base, wherein a length of the protrusion portion end surface between the opposing second walls is longer than a length of the protrusion portion end surface between the opposing first walls.

2. The ultrasonic bonding jig according to claim 1, further comprising:

a protrusion group that includes a plurality of separated protrusion portions;

a flat portion among protrusions formed among the protrusion portions; and an annular flat portion that surrounds the protrusion group.

3. An ultrasonic bonding method comprising:

stacking a metal plate and a base material;

pressing the metal plate to the base material by the ultrasonic bonding jig according to claim 1; and vibrating the ultrasonic bonding jig in a direction parallel to the first walls.

4. The ultrasonic bonding method according to claim 3, wherein the metal plate is a thin single-layer metal plate, and the base material is a single-layer metal plate thicker than the metal plate.

5. The ultrasonic bonding method according to claim 3, wherein the metal plate is a flexible circuit board, and the base material is a busbar.

* * * * *